United States Patent [19]

DiCarolis

[11] Patent Number: 4,904,638

[45] Date of Patent: Feb. 27, 1990

[54] METHOD OF PRODUCING SUPERCONDUCTING CERAMICS BY CO-PRECIPITATION OF CARBONATES

[75] Inventor: Stephen A. DiCarolis, Santa Clara, Calif.

[73] Assignee: Hewlett-Packard Company, Palo Alto, Calif.

[21] Appl. No.: 163,426

[22] Filed: Mar. 3, 1988

[51] Int. Cl.$^4$ .......................... C01F 17/00; C01G 3/00
[52] U.S. Cl. ........................................ 505/1; 505/738;
423/158; 423/263; 423/265; 423/593; 423/604;
423/637; 423/639; 501/123; 501/152; 502/525;
502/355; 252/521
[58] Field of Search ................... 505/1; 423/158, 263,
423/637, 639, 593, 593 C, 604, 265; 501/123,
152; 252/521; 502/355

[56] References Cited

PUBLICATIONS

Skoog et al.; *Fundementals of Analytical Chemistry* Holt, Reinhart and Winston Inc., N.Y., 1963, pp. 188–191.
Voight et al., "A Hydroxycarbonate Route to Superconductor Precursor Powders", Materials Research Society Symposium Proceedings, vol. 99, Nov. 30–Dec. 4, 1987, Massachusetts, pp. 635–638.
Fujiki et al., "Preparation of High—Tc Y—Ba—Cu—O Superconductor Using Collodial Methods", Japanese Journal of Applied Physics, vol. 26, No. 7, Jul. 1977, pp. L1159–L1160.
Ginley et al., "Grain Boundary Superconductivity in the YBaCuO System", Materials Research Society Proceedings of Symposiums, Spring 1987, pp. 201–204.
Communications in Organic Chemistry, vol. 26, No. 10, 1987, Comparison of Carbonate, Citrate and Oxalate Chemical Routes to the High—Tc Metal Oxide Superconductors $La_{z-x}Sr_xCuO_4$.
M. L. Salutsky et al., "The Rare Earth Metals and Their Compounds, XII. Carbonates of Lanthanum, Neodymium and Samarium", *Journal of the American Chemical Society*, vol. 72, Jul. 1950, pp. 3306–3307.
Earl L. Head et al., "The Preparation and Thermal Decomposition of the Carbonates of Tb, Dy, Ho, Er, Tm, Yb, Lu, Y, and Sc", *Proceedings of the Fourth Conference on Rare Earth Research, Apr. 22–25, 1964*, pp. 707–718.

*Primary Examiner*—Robert L. Stoll
*Assistant Examiner*—Paige C. Harvey

[57] ABSTRACT

A process is disclosed for producing a homogeneous mixture of co-precipitated carbonate salts capable of reacting together in an oxygen atmosphere at an elevated temperature to form a superconducting ceramic which comprises forming a first solution by dissolving in a first solvent maintained at a temperature of from about 15° to 35° C. a rare earth compound, an alkaline earth metal compound, and a copper compound capable of reacting with a carbonate ion to form an insoluble precipitate of carbonate salts in the solvent used to form the solution; forming a second solution containing a carbonate-forming compound dissolved in a second solvent miscible with the first solvent; blending the first and second solutions together at a temperature of from about 0° to 15° C. to inhibit formation of a precipitate; and heating the blended solutions to a temperature sufficient to cause the carbonate-forming compound dissolved in the second solution to decompose to form carbonate anions to thereby form a carbonate precipitate comprising a homogeneous mixture of the carbonate salts of the rare earth, alkaline earth metal, and copper compounds dissolved in the first solution.

23 Claims, 1 Drawing Sheet

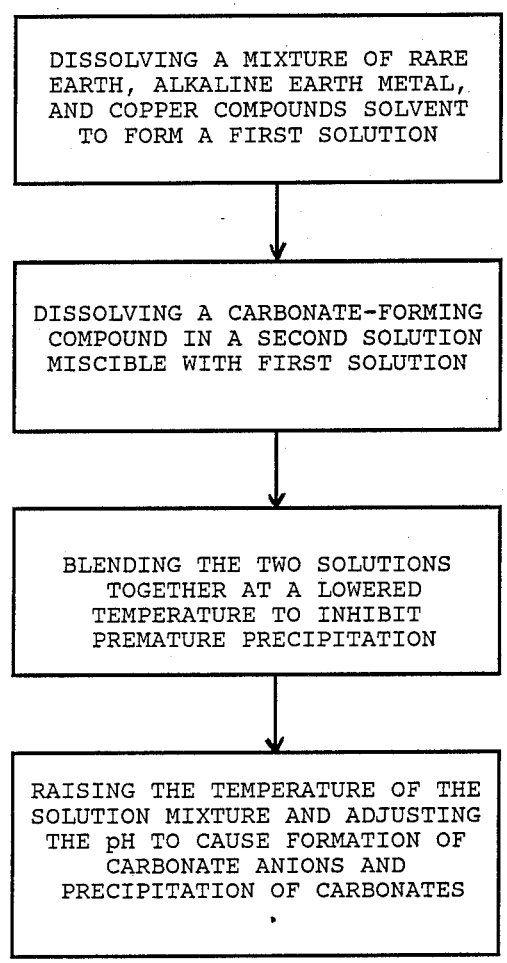

METHOD OF PRODUCING SUPERCONDUCTING CERAMICS BY CO-PRECIPITATION OF CARBONATES

BACKGROUND OF THE INVENTION

1. Field of the Invention

This invention relates to the production of superconducting ceramics. More particularly, this invention relates to an improved process for mixing the reactants used in forming the superconducting ceramic.

2. Description of the Related Art

Since the discovery of superconductivity in 1911, the phenomena of a material being able to conduct electricity with almost no resistance when the material is cooled to a temperature approaching absolute zero (0° K.) has remained an interesting scientific curiosity having few applications which would justify the expense of maintaining the necessary liquid helium cooled system.

Recently, however, superconducting ceramic materials have been produced which exhibit this phenomena at much higher temperatures, e.g., in some cases even higher than the boiling point of liquid nitrogen which boils at about 77° K. The ability to produce superconductivity, for example, in a material cooled by liquid nitrogen completely changes the economics which have previously restricted the applications to which superconductivity could be applied.

These new ceramic materials are sometimes referred to as triple-layer perovskite compounds because of the crystallography of the resulting structure; or 1-2-3 compounds because of the atomic ratios of 1 atom of a rare-earth (Lanthanum series) element such as lanthanum or yttrium, 2 atoms of an alkaline earth metal such as barium or strontium, and 3 atoms of copper. The superconducting ceramic also contains from 6.5+ to 7− atoms of oxygen which is usually referred to as $O_{(6.5+x)}$ where x is greater than 0 and less than 0.5, resulting in a chemical formula such as, for example, $YBa_2Cu_3O_{(6.5+x)}$.

The prevalent method used to produce this type of superconducting ceramic is to mechanically mix powders of the oxides or carbonates of the respective rare earth, alkaline earth metal, and copper elements in the 1-2-3 structure of the superconductor, calcine the mixture to remove water or other volatiles, and then fire the powder mixture in an oxygen atmosphere at a temperature sufficiently high to produce the desired superconducting phase.

However, the inadequacies of the mixing process is evidenced by the variations in compositions of the resulting fired ceramic material, and consequently, variations in properties. The mixing process, usually in a ball mill, takes many hours, and sometimes introduces impurities from the balls or the ball milling vessel.

It would, therefore, be desirable to provide a more satisfactory method of mixing the reactants used in forming the superconducting ceramic in a manner which would produce more uniform results in the ceramic material formed from the reactant mixture.

It is known to co-precipitate more than one compound from a solution using a common anion such as, for example, an oxalate. However, if such a mixture of co-precipitated oxalate compounds was subsequently fired, a residue such as elemental carbon could be left which could then be a contaminant. Other co-precipitation processes may also involve the use of an anion which includes carbon or might use an anion containing another metal, e.g., a chromate.

The precipitation of rare earth carbonates by hydrolysis of rare earth trichloroacetates is discussed by Salutsky et al in "The Rare Earth Metals and their Compounds XII, Carbonates of Lanthanum, Neodymium, and Samarium", published in Volume 72 of the Journal of the American Chemical Society, at pages 3306–3307 in 1950. This type of formation of rare earth carbonates is also discussed by Head et al in an article entitled "The Preparation and Thermal Decompositions of Some Rare Earth Carbonates", published in the Proceedings of the Third conference on Rare Earth Research, at pp. 51–63 in 1963; and in another Head et al article "The Preparation and Thermal Decomposition of the Carbonates of Tb, Dy, Ho, Er, Tm, Yb, Lu, Y, and Sc", published in the Proceedings of the Fourth conference on Rare Earth Research, at pp. 707–718 in 1964.

SUMMARY OF THE INVENTION

I have now discovered that I can form a homogeneous mixture of the reactants used in forming a superconducting ceramic of the 1-2-3, or triple-layer perovskite type by co-precipitating the reactants as insoluble carbonates which, upon subsequent firing, leave no contaminating residues.

It is, therefore, an object of this invention to provide a process for the formation of a material from a homogeneous mixture of reactants formed by chemical precipitation of the reactants in insoluble form from a solution.

It is another object of this invention to provide a process for the formation of a material by solid state reactions from a homogeneous mixture of reactants formed by chemical precipitation of the reactants in insoluble form from a solution.

It is yet another object of this invention to provide a process for the formation of a superconducting ceramic from a homogeneous mixture of reactants formed by chemical precipitation of the reactants in insoluble form from a solution.

It is still another object of this invention to provide a process for the formation of a superconducting ceramic from a homogeneous mixture of reactants formed by chemical co-precipitation of the reactants as insoluble carbonates from a solution.

It is a further object of this invention to provide a process for the formation of a superconducting ceramic of the type having the formula $XY_2Cu_3O_{(6.5+a)}$ wherein X is a rare earth element, Y is an alkaline earth metal, and a is greater than 0 and less than 0.5; from a homogeneous mixture of reactants comprising one or more rare earth carbonates, one or more alkaline earth metal carbonates, and copper carbonate formed by chemical co-precipitation of the reactants as insoluble carbonates from a solution.

These and other objects of the invention will be apparent from the following description and accompanying flow sheet.

BRIEF DESCRIPTION OF THE DRAWINGS

The sole drawing is a flow sheet describing the process of the invention.

DETAILED DESCRIPTION OF THE INVENTION

The invention comprises a novel process for forming a homogeneous mixture of reactants which may be used in the formation of a material by solid state reactions wherein the purity of the reactants and the homogeneous nature of the reactant mixture are critical to the formation of the desired material. The invention will be described, by way of illustration and not of limitation, as it applies to the formation of a superconducting ceramic of the 1-2-3 or triple layer perovskite type having the formula: $XY_2Cu_3O_{(6.5+a)}$ wherein X is a rare earth element, Y is an alkaline earth metal, and a is greater than 0 and less than 0.5.

To form this superconducting ceramic material, it is important that the reactants, a rare earth compound, an alkaline earth compound, and a copper compound, be free from contamination and that they be homogeneously mixed together prior to firing of the reactant mixture to form the desired superconducting ceramic. In accordance with the invention, this may be achieved by co-precipitating the reactants as carbonates from a solution.

In carrying out the process, the rare earth metal compound, the alkaline earth metal compound, and the copper compound must all be dissolved in a common solvent to form a first solution. While the solvent may be an aqueous or polar solvent or an organic solvent, it must be a solvent in which all of the compounds will dissolve and one in which the corresponding carbonate will be insoluble. A useful and inexpensive solvent which may be used in the process and which is readily available in highly purified form is pure water. By pure water, is meant deionized water having a conductivity of less than about $6 \times 10^{-8}$ mhos/cm (Resistivity of about 18 megohm·cm).

A second solution is also formed which contains the material capable of forming the carbonate anion as will be explained below. As will also be explained in more detail below, after formation of the two solutions, both solutions are chilled to prevent premature precipitation and then thoroughly blended together after which the temperature of the mixture is raised to cause the desired precipitation of the mixture of carbonate salts.

The rare earth compound used in the process may comprise those nitrate, sulfate, halide, or organic salts of a rare earth which will dissolve in the solvent employed and which will react with the other reactants to form the desired superconducting ceramic. Generally such rare earths include scandium, yttrium, and any of the lanthanide series of rare earths, including lanthanum, neodymium, promethium, samarium, europium, gadolinium, terbium, dysprosium, holmium, erbium, thulium, ytterbium, and lutetium; with the possible exceptions of cerium and praseodymium which have not, to date, been successfully used in forming such superconducting ceramics.

The alkaline earth metal compound may comprise those nitrate, sulfate, halide, or organic salts of an alkaline earth metal which will dissolve in the solvent employed and which will react with the other reactants to form the desired superconducting ceramic. Particularly desirable for this purpose are barium and strontium.

The copper salt used may also comprise those nitrate, sulfate, halide, or organic salts of copper which will dissolve in the solvent employed and which will react with the other reactants to form the desired superconducting ceramic.

Furthermore, the particular anion used with the rare earth salt, alkaline earth metal salt, or copper salt, in forming the first solution must not be one which will, in the solvent used, react with any of the other cations to form an insoluble precipitate. For example, the anion in the particular alkaline earth metal salt dissolved in the solvent must not be one which would react with the dissolved copper or the particular rare earth being used to form a precipitate. Thus, while it is not necessary, it is desirable that all of the salts used comprise the same anion, as the above problem can always be avoided by such a practice.

The relative amounts of the rare earth, alkaline earth metal, and copper salts dissolved in the solvent to form the first solution should correspond to the desired stoichiometry in the carbonates which will ultimately be precipitated in the process. Thus, for example, to form the 1-2-3 or triple layer perovskite type having the formula $XY_2Cu_3O_{(6.5+a)}$, as discussed above, it is necessary to use salts in a ratio which will provide three atoms of copper per two atoms of alkaline earth metal and one atom of rare earth.

It should be noted that it is not necessary nor desirable to saturate the solution with the salts. However, there must be a sufficient amount of the salts dissolved in the solvent, relative to the various temperatures used in forming the solutions, mixing the solutions, and the desired reaction (precipitation) temperature, which advantageously will be at ambient temperature (25° C.), to facilitate the subsequent precipitation of the carbonates. The actual amounts of the three salts used in forming the first solution will, therefore, vary with these temperature and so the parameters of temperature in the process must be considered first when discussing amounts of salts to be used.

With respect to temperatures employed in the process, the reaction may be carried out over a wide temperature range if so desired. However, the actual temperatures chosen will probably be guided by economic restraints. Basically the three temperatures involved in the process are: (1) the temperature at which the three salts are dissolved in the solvent to form the first solution; (2) the temperature to which the first solution (and the second solution) must be cooled prior to mixing of the solutions to avoid premature precipitation prior to thorough mixing of the solutions; and (3) the temperature at which the precipitation is carried out. There is also an initial temperature used for dissolving the carbonate-forming material to form the second solution but this will usually be about the same as the dissolving temperature used in forming the first solution.

With respect to the initial temperature used during dissolution of the salts to form the first solution, as well as in forming the second solution containing the carbonate-forming material, advantageously this temperature will be close to ambient (about 20°-25° C.) but may range from about 15° to about 35° C. if desired.

The amount of salts dissolved to form the first solution at the above listed temperature range will, therefore, comprise from about 70 to 90% of the saturation amount for the particular temperature with the higher amount preferred from the standpoint of yield of precipitated carbonate and the lower end of the range preferred from the standpoint of avoiding premature precipitation during blending of the two solutions.

The blending temperature will probably range from about 10 to 20 degrees cooler than the dissolution temperature to provide adequate protection against premature precipitation during blending of the solutions with the lower end of the temperature range preferred when the amount of dissolved salts in the first solution is at the high end of the concentration range. Preferably, the blending temperature will be maintained in a range of about 0° to 15° C., and more preferably about 5° C.

The precipitation temperature must be high enough to permit reaction or decomposition of the carbonate-forming material to release the carbonate anion. When trichloroacetic acid is used as the carbonate-forming material, for example, the temperature will preferably range from about 50° to about 90° C., more preferably about 80° C., to provide sufficient formation of the carbonate anion to realize a high yield of the precipitated carbonate salts with the actual temperature selected with regard to the economical advantages of higher yield relative to the cost of operating the precipitation step at an elevated temperature.

Thus, advantageously, the salts will be dissolved to form the first solution at about ambient temperature, i.e. about 20°–25° C., the solution cooled to about 5° C. while it is blended with the second solution, and the temperature of the mixture then raised to an elevated temperature to obtain the desired formation or release of the carbonate anion and subsequent precipitation.

As referred to above, when the rare earth, alkaline earth metal, and copper salts have all been dissolved in the solvent, the resulting solution is blended with a second solution which has dissolved therein a carbonate-forming chemical.

The second solution preferably uses the same solvent as in the first solution or at least uses a solvent miscible with the first solvent. Dissolved in the second solvent is a material capable of supplying the carbonate ion to the process when the two solutions are blended together without contributing any other ions which are capable of reacting with the ions in the first solution to form any undesired precipitates. In a preferred embodiment, the second solvent, like the first solvent, comprises pure water. Preferably, the carbonate-forming material dissolved therein is a water-soluble acid or ester capable of decomposing to form carbonate ions. Examples of water-soluble acids dissolvable in this second solvent to form a source of carbonate ion include trihaloacetic acids such as trichloroacetic acid, tribromoacetic acid, and trifluoroacetic acid. Examples of water-soluble esters include methyl acetoacetate and ethyl N-methyl carbamate which should hydrolyze to form $CO_2/CO_3^{2-}$ with appropriate pH control.

While the carbonate ion could also be formed, for example, by bubbling $CO_2$ gas through the first solution, it is important to the practice of the invention that a single phase, i.e., all liquid phase, be used rather than a mixture of gas and liquid phases to achieve the desired thorough and homogeneous mixture of the rare earth, alkaline earth metal, and copper ions with the carbonate-forming phase.

The concentration of the carbonate-forming material in the second solvent should range from a minimum of at least about 70% of saturation at the dissolution temperature up to about 90% of saturation at the dissolution temperature. As discussed with respect to the formation of the first solution, the higher amount may be preferred from a standpoint of yield while the lower concentration may be preferred from a standpoint of avoiding premature precipitation during mixing of the two solutions.

After forming the second solution, the pH is adjusted, for example, using quaternary ammonium hydroxides such as tetraethylammonium hydroxide or tetramethylammonium hydroxide, to about 6.5 to 7.0. The neutralization of the trichloroacetic acid by tetramethylammonium hydroxide may be illustrated by the following reaction:

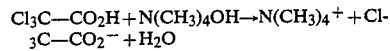
$Cl_3C-CO_2H + N(CH_3)_4OH \rightarrow N(CH_3)_4^+ + Cl_3C-CO_2^- + H_2O$ After the respective solutions have been formed and the pH of the second solution adjusted, the solutions are each chilled, preferably to a temperature of about 0° to 15° C., more preferably about 5° C., to avoid premature precipitation, as discussed above, and then thoroughly blended together. This may be accomplished, for example, by mechanically stirring the mixture for 10 minutes while maintaining the temperature at about 5° C. The pH of the blended mixture is then adjusted further to about 5.5 and the solution mixture heated to a temperature of about 50°–90° C., preferably about 80° C., to cause the desired precipitation. While the solution is being heated to about 80° C., i.e., the temperature of the solution is being ramped up to 80° C., further additions of tetramethylammonium hydroxide are made as needed to keep the pH at from 5.5 to 6.0. At 80° C., the precipitation is complete and the pH is then finally adjusted to about 7.0 at this point using further tetramethylammonium hydroxide. The dissolution, at this temperature, of the trichloroacetic acid to form the carbonate ion and the resulting carbonate precipitation may be illustrated by the following equations:

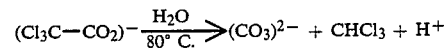
$$(Cl_3C-CO_2)^- \xrightarrow[80°\,C.]{H_2O} (CO_3)^{2-} + CHCl_3 + H^+$$

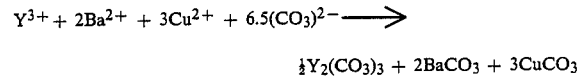
$$Y^{3+} + 2Ba^{2+} + 3Cu^{2+} + 6.5(CO_3)^{2-} \longrightarrow$$
$$\tfrac{1}{2}Y_2(CO_3)_3 + 2BaCO_3 + 3CuCO_3$$

The resulting precipitation of a homogeneous mixture of rare earth carbonate, alkaline earth metal carbonate, and copper carbonate is then filtered to recover the carbonate salt mixture.

The resulting carbonate mixture may then be dried at a temperature of about 50°–150° C. for a period of 2–10 hours, at which point the carbonate mixture may be subjected to conventional processing to form the desired superconducting ceramic, e.g., heated to a temperature of from about 650° to 850° C. for a period of about 4 to 36 hours in an oxygen-bearing atmosphere.

To further illustrate the process of the invention, 18.25 grams of Yttrium nitrate hexahydrate ($Y(NO_3)_3 \cdot 6H_2O$) 26.2 grams of barium nitrate ($Ba(NO_3)_2$) and 36.2 grams of copper nitrate trihydrate ($Cu(NO_3)_2 \cdot 3H_2O$) were dissolved in 1.0 liters of pure water at 25° C. to form a first solution. A second solution was prepared by dissolving 116.8 grams of trichloroacetic acid in 1.0 liters of pure water at 25° C. The second solution was neutralized to a pH of 7.0 by adding 76.5 grams of tetramethylammonium hydroxide (255.0 grams of a 30% by volume aqueous solution).

The two solutions were each respectively chilled to about 5° C. and then mixed together for about 10 minutes. The combined solution was then further neutralized to a pH of about 5.5 by adding 7 grams of tetramethylammonium hydroxide (in a 30% by volume aqueous solution) and then the temperature of the mixture was raised up to about 80° C. at a rate of about 3°–4° C. per minute. A further 50 grams of tetramethylammonium hydroxide (in a 30% by volume aqueous solution) were added during the positive temperature ramp to maintain the pH at 5.0 to 5.5. Then at 80° C. about 5 grams of additional tetramethylammonium hydroxide (in a 30% by volume aqueous solution) was added to bring the pH to 7.0. After allowing the solution stand for 1 hours, the mixture was filtered and the precipitated carbonate mixture recovered.

The carbonate mixture was dried for 2 hours at 110° C. and then weighed. 48.5 grams of precipitate were recovered. The mixture was analyzed and found to contain 10.3 grams of yttrium carbonate, 19.7 grams of barium carbonate, and 18.5 grams of copper carbonate, thus indicating that the desired stoichiometric mixture of the three carbonates had co-precipitated together.

The dried mixture was then placed in a furnace under an oxygen atmosphere and heated to 800° C. for 4 hours. The resulting ceramic was then immersed in liquid nitrogen and tested to determine whether the ceramic exhibited the Meissner effect (levitation of a magnet above the cooled ceramic) indicative that the ceramic had superconducting properties. The test indicated that a superconducting ceramic had, indeed, been produced.

Thus, the invention provides a process for producing a homogeneous mixture of the reactants used in forming a superconducting ceramic capable of exhibiting superconducting properties at temperatures as high as the boiling point of liquid nitrogen.

Having thus described the invention, what is claimed is:

1. A process for producing a homogeneous mixture of materials which comprises:
   (a) forming a first solution by dissolving in a first solvent two or more compounds having cations capable of reacting with a carbonate ion to form an insoluble precipitate of carbonate salts in the solvent used to form the solution;
   (b) forming a second solution containing a carbonate-forming compound dissolved in a second solvent miscible with said first solvent;
   (c) blending said first and second solutions together at a temperature sufficiently low to inhibit formation of a precipitate; and
   (d) heating said blended solutions sufficiently to form a carbonate precipitate comprising a homogeneous mixture of the carbonate salts of the compounds dissolved in said first solution.

2. The process of claim 1 wherein said step of heating said blend of solutions further comprises heating said blend of solutions to a temperature sufficient to cause said compound dissolved in said second solution to decompose to form said carbonate anion.

3. The process of claim 2 wherein said step of heating said blend of solutions further comprises heating said blend of solutions to a temperature of from about 50° to about 90° C. to cause said compound dissolved in said second solution to decompose to form said carbonate anion.

4. The process of claim 2 wherein said step of heating said blend of solutions further comprises heating said blend of solutions to a temperature of about 80° C. to cause said compound dissolved in said second solution to decompose to form said carbonate anion.

5. The process of claim 2 wherein said step of heating said blend of solutions further comprises finally adjusting the pH of said blend to about 7.0 after said reaching said temperature sufficient to cause said compound dissolved in said second solution to decompose to form said carbonate anion.

6. A process for producing a homogeneous mixture of precipitated carbonate salts capable of reacting together in an oxygen atmosphere at an elevated temperature to form a superconducting ceramic which comprises:
   (a) forming a first solution by dissolving in a first solvent maintained at a temperature of from about 15° to 35° C. a rare earth compound, an alkaline earth metal compound, and a copper compound capable of reacting with a carbonate ion to form an insoluble precipitate of carbonate salts in the solvent used to form the solution;
   (b) forming a second solution containing a carbonate-forming compound selected from the class consisting of trihaloacetic acid, methyl acetoacetate, and ethyl N-methyl carbamate dissolved in a second solvent miscible with said first solvent;
   (c) adjusting the pH of said second solution to about 7.0;
   (d) blending said first and second solutions together at a temperature of from about 0° to 15° C. to inhibit formation of a precipitate;
   (e) adjusting the pH of said blend of solutions to about 5.5–6.0; and
   (f) heating said blended solutions to a temperature sufficient to cause said compound dissolved in said second solution to decompose to form said carbonate anion to form a carbonate precipitate comprising a homogeneous mixture of the carbonate salts of said rare earth, alkaline earth metal, and copper compounds dissolved in said first solution.

7. A process for producing a homogeneous mixture of co-precipitated carbonate salts consisting essentially of a mixture of rare earth carbonates, alkaline earth metal carbonates, and copper carbonates in a ratio sufficient to permit reacting the carbonate mixture together in an oxygen atmosphere at an elevated temperature to form a superconducting ceramic having the formula $XY_2Cu_3O_{(6.5+a)}$, wherein X is a rare earth element, Y is an alkaline earth metal, and a is greater than 0 and less than 0.5 which comprises:
   (a) forming a first solution by dissolving, in a first solvent maintained at a temperature of from about 15° to 35° C., a mixture of compounds, in a ratio of three rare earth atoms, two alkaline earth atoms and one copper atom, capable of reacting with a carbonate ion to form an insoluble co-precipitate of carbonate salts in the solvent used to form the solution, said mixture of compounds consisting essentially of:
      (1) a rare earth compound selected from the class consisting of nitrate, sulfate, halide, or organic salts of a rare earth;
      (2) an alkaline earth metal compound selected from the class consisting of nitrate, sulfate, halide, or organic of an alkaline earth metal; and
      (3) a copper compound selected from the class consisting of nitrate, sulfate, halide, or organic salts of copper;
   (b) forming a second solution by dissolving, in a second solvent miscible with said first solvent and also maintained at a temperature of from about 15° to 35° C., a carbonate-forming compound selected from the class consisting of trichloroacetic acid, tribromoacetic acid, and trifluoroacetic acid;
   (c) adjusting the pH of said second solution to about 7.0;

(d) blending said first and second solutions together at a temperature of from about 0° to 15° C. to inhibit formation of a precipitate;

(e) adjusting the pH of said blend of solutions to about 5.5–6.0; and (f) heating said blended solutions to a temperature of from about 50° to 90° C. while maintaining said pH at from about 5.5–6.0 and then, after reaching said temperature, adjusting the pH to about 7.0 to cause said carbonate-forming compound dissolved in said second solution to decompose to form said carbonate anion to form a carbonate precipitate comprising a homogeneous mixture of rare earth metal carbonates, alkaline earth metal carbonates, and copper carbonates in a stoichiometric ratio of three rare earth atoms per two alkaline earth metal atom per copper atom.

8. A process for producing a homogeneous mixture of materials capable of being subsequently formed into a superconducting ceramic which comprises:

(a) forming a first solution by dissolving in a first solvent two or more compounds having cations capable of reacting with carbonate ions to form an insoluble precipitate of carbonate salts in the solvent used to form the solution;

(b) forming a second solution consisting essentially of a second solvent miscible with said first solvent and a carbonate-forming compound dissolved therein capable of forming carbonate ions upon subsequent heating of the solution;

(c) blending said first and second solutions together into a homogeneous mixture at a temperature sufficiently low to inhibit formation of said carbonate ions or a precipitate; and (d) heating said blended mixture sufficiently to form said carbonate ions resulting in formation of a carbonate precipitate comprising a homogeneous mixture of the carbonate salts of said cations in said compounds dissolved in said first solution.

9. The process of claim 8 wherein said step of forming said first solution is carried out by dissolving said compounds therein at a temperature of from about 15° to about 35° C.

10. The process of claim 9 wherein said step of forming said first solution further comprises adding said compounds to said first solvent in an amount comprising from about 70 to 90% of the saturation amount at the temperature at which said compounds are dissolved in said first solution.

11. The process of claim 9 wherein said step of forming said first solution is carried out by dissolving said compounds therein at a temperature of from about 20° to about 25° C.

12. The process of claim 9 wherein said step of forming said first solution further comprises dissolving in said first solvent a rare earth compound, an alkaline earth compound, and a copper compound.

13. The process of claim 12 wherein said step of forming said first solution further comprises dissolving said compounds in a stoichiometric ratio selected to provide a precipitate of carbonates having a ratio of one atom of rare earth element per two atoms of alkaline earth metal and three atoms of copper.

14. The process of claim 12 wherein said step of heating to form a carbonate precipitate further includes precipitating a mixture of rare earth, alkaline earth metal, and copper carbonates sufficiently homogeneous to permit formation of a superconducting ceramic therefrom having the formula $XY_2Cu_3O_{(6.5+a)}$, wherein X is a rare earth element, Y is an alkaline earth metal, and a is greater than 0 and less than 0.5, upon subsequent heating of said carbonate mixture to a temperature of from about 650° to about 850° C. in the presence of oxygen for a period of from about 4 to about 36 hours.

15. The process of claim 8 wherein said step of forming said second solution is carried out by dissolving said carbonate-forming compound therein at a temperature of from about 15° to about 35° C.

16. The process of claim 15 wherein said step of forming said second solution is carried out by dissolving said carbonate-forming compound therein at a temperature of from about 20° to about 25° C.

17. The process of claim 16 wherein said step of forming said second solution by dissolving a carbonate-forming compound in a second solvent further comprises dissolving a carbonate-forming compound selected from the class consisting of water-soluble acids capable of decomposing to form carbonate ions and water-soluble-esters capable of dissolving to form carbonate ions.

18. The process of claim 17 wherein said carbonate-forming compound dissolved in said second solution is selected from the class consisting of trihaloacetic acid, methyl acetoacetate, and ethyl N-methyl carbamate.

19. The process of claim 17 wherein said carbonate-forming compound dissolved in said second solution is selected from the class consisting of trichloroacetic acid, tribromoacetic acid, and trifluoroacetic acid.

20. The process of claim 15 wherein said step of forming said second solution further includes adjusting the pH of said second solution to about 7.0 after said compound is dissolved therein and prior to said blending step.

21. The process of claim 8 wherein said step of blending said first and second solutions further comprises cooling said solutions to a temperature of from about 0° to about 15° C. prior to blending said solutions together.

22. The process of claim 21 wherein said step of blending said first and second solutions further comprises cooling said solutions to a temperature of about 5° C. prior to blending said solutions together.

23. The process of claim 21 wherein the pH of said blended mixture of solutions is adjusted to about 5.5 to 6.0 prior to heating said blended mixture to form said carbonate anion and resulting co-precipitation of carbonate salts.

* * * * *